(12) United States Patent
Shi et al.

(10) Patent No.: US 10,333,823 B2
(45) Date of Patent: Jun. 25, 2019

(54) METHOD AND APPARATUS FOR ROUTING PACKET IN ACCELERATOR NETWORK

(71) Applicant: HUAWEI TECHNOLOGIES CO., LTD., Shenzhen, Guangdong (CN)

(72) Inventors: Ziliang Shi, Toronto (CA); Huaxi Gu, Xi'an (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 16/109,694

(22) Filed: Aug. 22, 2018

(65) Prior Publication Data

US 2018/0367443 A1 Dec. 20, 2018

Related U.S. Application Data

(63) Continuation of application No. PCT/CN2017/074705, filed on Feb. 24, 2017.

(30) Foreign Application Priority Data

Feb. 24, 2016 (CN) .......................... 2016 1 0100867

(51) Int. Cl.
*H04L 12/721* (2013.01)
*G06F 17/50* (2006.01)
*G06F 9/50* (2006.01)

(52) U.S. Cl.
CPC .............. *H04L 45/12* (2013.01); *G06F 9/50* (2013.01); *G06F 17/5077* (2013.01); *H04L 45/26* (2013.01)

(58) Field of Classification Search
None
See application file for complete search history.

(56) References Cited

U.S. PATENT DOCUMENTS 7,103,065 B1 * 9/2006 Quigley ................ H04L 1/0003
370/465
7,457,861 B1 * 11/2008 Ebersole ............. H04L 12/4625
370/258

(Continued)

FOREIGN PATENT DOCUMENTS

CN 102104544 A 6/2011
CN 103139068 A 6/2013
(Continued)

OTHER PUBLICATIONS

Dilli Ravilla et al, Performance comparisons of ZRP and IZRP routing protocols for ad hoc wireless networks. 2011 International Conference on Energy, Automation and Signal, Feb. 9, 2012, 8 pages.

(Continued)

*Primary Examiner* — Crystal L Hammond
(74) *Attorney, Agent, or Firm* — Womble Bond Dickinson (US) LLP

(57) ABSTRACT

A method for routing a packet in an accelerator network is provided, the method includes: receiving, by a first accelerator which is any accelerator in an accelerator network, an acceleration request packet which includes an acceleration sequence and to-be-accelerated data from a CPU, the acceleration sequence is used to indicate a plurality of acceleration types used for accelerating the data and indicate an order of the plurality of acceleration types; determining, by the first accelerator, a target loop path of the acceleration request packet based on an acceleration information table which includes location information and acceleration type information of a plurality of accelerators in the accelerator network and accelerators on the target loop path are capable of performing acceleration processing on the acceleration request packet according to an indication of the acceleration (Continued)

sequence; and routing, by the first accelerator, the acceleration request packet according to the target loop path.

14 Claims, 9 Drawing Sheets

(56) References Cited

U.S. PATENT DOCUMENTS

| | | | |
|---|---|---|---|
| 7,581,033 B2* | 8/2009 | Ebersole | G06F 13/385 709/223 |
| 8,966,457 B2* | 2/2015 | Ebcioglu | G06F 17/5045 717/136 |
| 9,537,937 B2* | 1/2017 | Mutschler | G06F 9/4856 |
| 2013/0080567 A1* | 3/2013 | Pope | G06F 13/385 709/213 |
| 2014/0236524 A1 | 8/2014 | Frediani et al. | |
| 2014/0244971 A1 | 8/2014 | Alvarez-Icaza Rivera et al. | |
| 2015/0103837 A1 | 4/2015 | Dutta | |
| 2015/0278148 A1 | 10/2015 | Sindhu et al. | |

FOREIGN PATENT DOCUMENTS

| | | |
|---|---|---|
| CN | 103281369 A | 9/2013 |
| CN | 103986585 A | 8/2014 |
| CN | 104657308 A | 5/2015 |
| CN | 104954253 A | 9/2015 |
| CN | 105229481 A | 1/2016 |
| CN | 105786618 A | 7/2016 |

OTHER PUBLICATIONS

Ge-Ming Chiu, The Odd-Even Turn Model for Adaptive Routing. IEEE Transactions on Parallel and Distributed Systems, vol. 11, No. 7, Jul. 2000, 10 pages.

Anand Seetharam et al, Routing With Adaptive Flooding in Heterogeneous Mobile Networks. 2015 IEEE, 8 pages.

C.J. Glass et al, The Turn Model for Adaptive Routing. [1992] Proceedings the 19th Annual International Symposium on Computer Architecture, Aug. 6, 2002, 10 pages.

Giuseppe Ascia et al, Implementation and Analysis of a New Selection Strategy for Adaptive Routing in Networks-on-Chip. IEEE Transactions on Computers, vol. 57, No. 6, Jun. 2008, 12 pages.

Jae H. Kim et al, Compressionless Routing: A Framework for Adaptive and Fault-Tolerant Routing. IEEE Transactions on Parallel and Distributed Systems, vol. 8, No. 3, Mar. 1997, 16 pages.

En-Jui Chang et al, Regional ACO-Based Cascaded Adaptive Routing for Traffic Balancing in Mesh-Based Network-on-Chip Systems. IEEE Transactions on Computers, vol. 64, No. 3, Mar. 2015, 8 pages.

Nattiya Khaitiyakun et al, Data dissemination on MANET using content delivery network (CDN) technique. The International Conference on Information Networking 2014 (ICOIN2014), Apr. 17, 2014, 5 pages.

"NiklasCarlsson et al, Caching and optimized request routing in cloud-based content delivery systems. Performance Evaluation vol. 79, Sep. 2014, pp. 38-55".

Li Fang-min et al, QoS Differentiated Service Routing for Wireless Multimedia Sensor Networks. Journal of Electronics , 2010 , 38 (10), 7 pages.

"Cui Yong et al, Link State-Based Precomputation for Multi-Constrained Routing. Acta Electronica Sinica, vol. 31, No. 8, Aug. 2003, 5 pages".

Liu Hong et al, Internet Routing Optimization Control Algorithm with Multiple Objective s. Acta Electronica Sinica, vol. 32 No. 2, Feb. 2004, 3 pages.

Lu Hui-mei et al, Delay-bandwidth constrained topology aggregation algorithm. Journal on Communications, vol. 28 No. 3, Mar. 2007, 8 pages.

Guan ai-hong et al, A Deflection routing algorithm based on priority and parameter-tunable in optical burst switching networks. Acta Electronica Sinica, vol. 39. No. 7, Jul. 2011, 5 pages.

Mrs. Kaleem Fatima et al, A New Hardware Routing Accelerator for Multi-terminal Nets. IEEE Computer Society, 2009 22nd International Conference on VLSI Design, 6 pages.

Shobha.K.R et al, Efficient Flooding Using Relay Routing in On-Demand Routing Protocol for Mobile Adhoc Networks. Proceedings of the 2009 IEEE 9th Malaysia International Conference on Communications Dec. 15-17, 2009 Kuala Lumpur Malaysia, 6 pages.

\* cited by examiner

METHOD AND APPARATUS FOR ROUTING PACKET IN ACCELERATOR NETWORK

CROSS-REFERENCE TO RELATED APPLICATIONS

This application is a continuation of International Application No. PCT/CN2017/074705, filed on Feb. 24, 2017, which claims priority to Chinese Patent Application No. 201610100867.3, filed on Feb. 24, 2016, all of the aforementioned patent applications are hereby incorporated by reference in their entireties.

TECHNICAL FIELD

This application relates to the field of application acceleration, and more specifically, to a method and an apparatus for routing a packet in an accelerator network.

BACKGROUND

Hardware acceleration is widely applied to the field of computers, the telecommunications field, and the like. Currently, Microsoft has deployed a field programmable gate array (FPGA) in a data center, to accelerate Bing search. As shown in FIG. 1, one peripheral component interconnect express (PCIe) card is disposed on each server, to connect central processing units (CPU) and FPGAs. The FPGAs are connected by using a separate network, to form an FPGA array network. The plurality of FPGAs jointly finish acceleration of an application such as searching and deep learning, and a data forwarding port between a plurality of FPGAs implementing acceleration of one application is designated by a corresponding CPU. Specifically, after a server of a data center receives a search request, the server analyzes content of the search request, divides a search task into a plurality of operations such as keyword extraction of web page searching, matching of a free expression, and grading, and distributes tasks corresponding to the operations to FPGAs. After performing the operations, the FPGAs return results to respective CPUs, and the CPUs send the results to a CPU initiating the request, so that the CPU aggregates the results. In the acceleration solution, an application developer needs to learn in advance an interconnection manner of the FGPAs, and designates a forwarding port of an intermediate result obtained after processing of the FPGAs. Therefore, in an FPGA acceleration network of Microsoft, a routing and forwarding path is designated by one or more CPUs corresponding to each application, and the FPGA network does not have a routing function. In addition, a conventional routing network implements routing from a source node to a unique destination node based on a media access control (MAC) address. For a network including accelerators of a plurality of acceleration types, if only an acceleration sequence is designated but a location of a destination accelerator is not designated, a corresponding packet cannot be routed to a plurality of destination accelerators, to implement application acceleration.

SUMMARY

This application provides a method and an apparatus for routing a packet in an accelerator network, to determine a target loop path of an acceleration request packet.

A first aspect provides a method for routing a packet in an accelerator network. The accelerator network includes a plurality of interconnected accelerators, each accelerator is connected to one central processing unit CPU, and each accelerator corresponds to one acceleration type. The method includes: receiving, by a first accelerator, an acceleration request packet from a CPU, where the first accelerator is any accelerator in the accelerator network, the acceleration request packet includes an acceleration sequence and data to be accelerated, and the acceleration sequence is used to indicate a plurality of acceleration types used for accelerating the data and indicate an order of the plurality of acceleration types; determining, by the first accelerator, a target loop path of the acceleration request packet based on an acceleration information table, where the acceleration information table includes location information and acceleration type information of the plurality of accelerators in the accelerator network, and accelerators on the target loop path are capable of performing acceleration processing on the acceleration request packet according to an indication of the acceleration sequence; and routing, by the first accelerator, the acceleration request packet according to the target loop path. In the solution of this application, the first accelerator obtains location information and acceleration type information of a plurality of accelerators corresponding to the acceleration sequence by using the acceleration information table of the first accelerator, then, determines the target loop path of the acceleration request packet based on the information, and routes the acceleration request packet according to the target loop path. Therefore, a loop path can be quickly determined for an acceleration request packet having a plurality of target accelerators in the accelerator network.

In one embodiment, the determining, by the first accelerator, a target loop path of the acceleration request packet based on an acceleration information table includes: obtaining, by the first accelerator based on the acceleration information table, location information of the accelerators corresponding to the acceleration types in the acceleration sequence; and determining, by the first accelerator, Manhattan distances of a plurality of loops including the first accelerator and the accelerators corresponding to the acceleration types in the acceleration sequence, and determining a loop having a shortest Manhattan distance as the target loop path. The loop having the shortest Manhattan distance is selected as the target loop path, so that the acceleration request packet can be processed within the shortest path, thereby increasing a speed of processing the acceleration request packet.

In one embodiment, after the first accelerator determines the target loop path, the method further includes: storing, by the first accelerator, the target loop path into an acceleration path table of the first accelerator, so that the first accelerator obtains the target loop path from the acceleration path table after receiving the acceleration request packet. The target loop path is stored in the acceleration path table of the node of the first accelerator, so that the first accelerator can directly obtain the target loop path from the acceleration path table after receiving the same acceleration request packet again, thereby reducing a repeated calculation process, and improving efficiency.

In one embodiment, the method further includes: receiving, by the first accelerator, a first flood packet sent by a third accelerator, where the third accelerator is any accelerator other than the first accelerator in the accelerator network, and the first flood packet includes acceleration type information and location information of the third accelerator; storing, by the first accelerator, the acceleration type information and the location information of the third accelerator into a node information table of the first accelerator; and updating, by the first accelerator, the acceleration information table based on the acceleration type information and the location information of the third accelerator that are stored in the node information table.

In one embodiment, the updating, by the first accelerator, the acceleration information table based on the acceleration type information and the location information of the third accelerator that are stored in the node information table includes: obtaining, by the first accelerator, the acceleration type information and the location information of the third accelerator from the node information table; determining, by the first accelerator, that the acceleration information table includes a fourth accelerator having a same acceleration type as that of the third accelerator; determining, by the first accelerator by using a location of the first accelerator as an origin of coordinates, whether the third accelerator and the fourth accelerator are located in a same quadrant; if the third accelerator and the fourth accelerator are located in the same quadrant, determining absolute values of a horizontal coordinate and a vertical coordinate of the third accelerator and absolute values of a horizontal coordinate and a vertical coordinate of the fourth accelerator; and if the absolute values of the horizontal coordinate and the vertical coordinate of the third accelerator are respectively less than the absolute values of the horizontal coordinate and the vertical coordinate of the fourth accelerator, storing the location information and the acceleration type information of the third accelerator into the acceleration information table, and deleting location information and acceleration type information of the fourth accelerator that are stored in the acceleration information table. A speed of updating the acceleration information table is relatively slow, and may be less than a flood packet receiving frequency. Therefore, to avoid an information loss, after receiving a flood packet of a nearby accelerator, the first accelerator first buffers information about the nearby accelerator in the node information table, and then, updates the acceleration information table based on the information about the nearby accelerator buffered in the node information table. In this way, a problem of a relatively slow speed of updating the acceleration information table can be resolved. In addition, during updating of the acceleration information table, an accelerator node covered by another accelerator node having a same acceleration type is excluded, so that a quantity of accelerator nodes having a same acceleration type in the acceleration information table can be effectively reduced, thereby reducing complexity of calculating a shortest loop path based on the acceleration information table.

In one embodiment, the method further includes: sending, by the first accelerator, a second flood packet to another accelerator in the accelerator network, where a flood distance of the second flood packet is determined based on a quantity of acceleration types in the accelerator network, and the second flood packet includes acceleration type information and location information of the first accelerator. During initialization of the accelerator network, an accelerator node sends a flood packet to a nearby accelerator node by using local flooding, so that large traffic generated by global flooding can be effectively avoided.

A second aspect provides a method for routing a packet in an accelerator network. The accelerator network includes a plurality of interconnected accelerators, each accelerator is connected to one central processing unit CPU, and each accelerator corresponds to one acceleration type. The method includes: receiving, by a first accelerator, an acceleration request packet from a CPU, where the first accelerator is any accelerator in the accelerator network, the acceleration request packet includes an acceleration sequence and data to be accelerated, and the acceleration sequence is used to indicate a plurality of acceleration types used for accelerating the data and indicate an order of the plurality of acceleration types; sending, by the first accelerator, a probe packet to a second accelerator in the accelerator network, so that the second accelerator determines a target loop path of the acceleration request packet based on an acceleration information table of the second accelerator, where the probe packet includes the acceleration sequence, the acceleration information table includes location information and acceleration type information of the plurality of accelerators in the accelerator network, and accelerators on the target loop path are capable of performing acceleration processing on the acceleration request packet according to an indication of the acceleration sequence; and routing, by the first accelerator, the acceleration request packet according to the target loop path. In the solution of this application, the first accelerator sends the probe packet to another accelerator in the accelerator network, so that the other accelerator determines the target loop path of the acceleration request packet. Therefore, a loop path can be quickly determined for an acceleration request packet having a plurality of target accelerators in the accelerator network.

A third aspect provides an apparatus for routing a packet in an accelerator network. The apparatus includes modules configured to perform the method in the first aspect.

A fourth aspect provides an apparatus for routing a packet in an accelerator network. The apparatus includes modules configured to perform the method in the second aspect.

A fifth aspect provides an apparatus for routing a packet in an accelerator network. The apparatus includes a memory, a processor, and a transceiver. The memory is configured to store a program, the processor is configured to execute the program, and the transceiver is configured to communicate with another accelerator in the accelerator network. When executing the program, the processor performs the method in the first aspect.

A sixth aspect provides an apparatus for routing a packet in an accelerator network. The apparatus includes a memory, a processor, and a transceiver. The memory is configured to store a program, the processor is configured to execute the program, and the transceiver is configured to communicate with another accelerator in the accelerator network. When executing the program, the processor performs the method in the second aspect.

In some implementations, an accelerator in the accelerator network is an acceleration module based on a field programmable gate array FPGA.

In some implementations, an accelerator in the accelerator network includes an acceleration module and a routing module. The acceleration module is configured to accelerate an application, and the routing module is configured to route an acceleration request packet.

In some implementations, the second accelerator is one of a plurality of accelerators corresponding to a plurality of acceleration types indicated in the acceleration sequence.

In some implementations, the second accelerator determines a target loop path of the acceleration request packet based on an acceleration path table or an acceleration information table of the second accelerator.

In some implementations, the second accelerator forwards the probe packet to another accelerator in the accelerator network, and that accelerator determines the target loop path of the acceleration request packet.

In some implementations, the number of acceleration types included in the accelerator network is N, and a local flooding range of each accelerator in the accelerator network is N. If N is relatively small, the local flooding range of each accelerator in the accelerator network may be set to 2*N or 4*N.

In some implementations, after receiving a flood packet sent by another accelerator in the accelerator network, the first accelerator stores acceleration type information and location information of the another accelerator into a node information table of the first accelerator. Subsequently, the first accelerator searches the node information table and an acceleration information table of the first accelerator, and if determining that a first-category accelerator exists in the node information table and no accelerator having a same acceleration type as that of the first-category accelerator exists in the acceleration information table, the first accelerator stores location information and acceleration type information of the first-category accelerator into the acceleration information table.

In this application, the first accelerator obtains, from the acceleration information table, the location information and the acceleration type information of the plurality of accelerators corresponding to the acceleration sequence, then, determines the target loop path of the acceleration request packet based on the information, and routes the acceleration packet according to the target loop path. Therefore, a loop path can be determined for an acceleration request packet having a plurality of target accelerators in the accelerator network.

DESCRIPTION OF EMBODIMENTS

The following describes the technical solutions in the embodiments of this application with reference to the accompanying drawings in the embodiments of this application. To better understand a method for choosing to route a packet in the embodiments of this application, the following first describes in detail an accelerator network to which the method for routing a packet in the embodiments of this application is applied.

Figure 1:
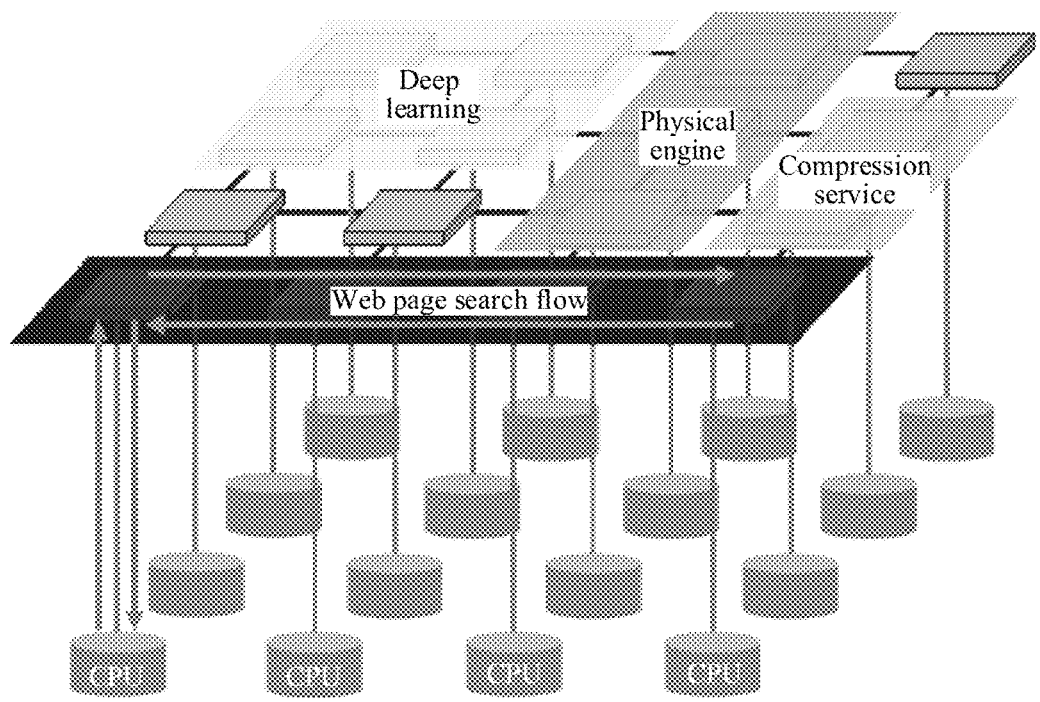
FIG. 1 is a schematic structural diagram of FPGAs deployed in a data center.
Figure 2:
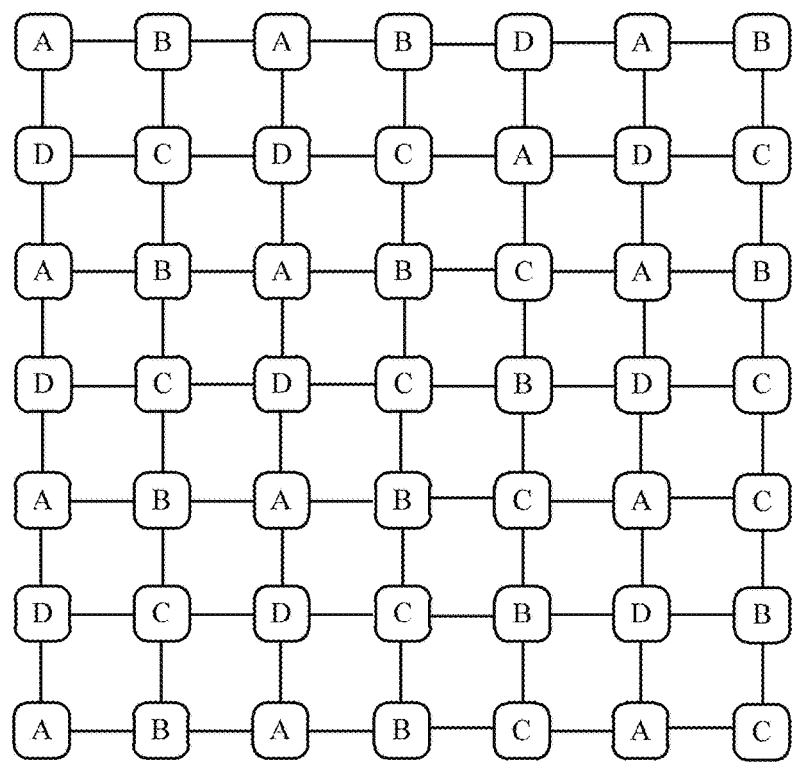
FIG. 2 is a schematic diagram of an accelerator network according to an embodiment of this application.

FIG. 2 is a schematic diagram of an accelerator network. In FIG. 2, A, B, C, and D represent four accelerators having different acceleration types. An accelerator may include an acceleration module and a routing module. The acceleration module may be implemented by programming an FPGA or a similar chip. The accelerator may be inserted into a server using a PCIe card. Each accelerator is connected to one CPU, and the accelerators are connected by using separate interconnection links, to form the accelerator network. Specifically, the accelerators may be connected by using a network having a topology structure such as 2D-Mesh (two-dimensional mesh) or 2D-Torus (two-dimensional torus). The acceleration module in the accelerator may implement an acceleration operation on a data request, and the routing module may calculate routing between accelerators.

Compared with a conventional data routing network, the accelerator network in the embodiments of this application has the following main features.

1. Non-unique destination acceleration nodes: Generally, the accelerator network includes a plurality of accelerators having a same acceleration type. When a source accelerator in the accelerator network receives an acceleration request packet sent by a CPU, there are a plurality of optional destination accelerators. In this case, a most appropriate accelerator is selected as a destination accelerator. In addition, some applications need sequential acceleration by accelerators of different types, and in this case, for a source accelerator, there are also a plurality of destination accelerators. For example, an application needs acceleration by a type-A accelerator and a type-B accelerator, and the application has two destination accelerators, namely, an accelerator having an acceleration type A and an accelerator having an acceleration type B. In this case, AB represents an acceleration sequence corresponding to the acceleration request. In other words, when the acceleration request is processed, the application is first accelerated by using the type-A accelerator, and is then accelerated by using the type-B accelerator. It should be understood that an acceleration type of the source accelerator may be type A. In this way, during acceleration, the source node implements the first acceleration. If the acceleration type of the source accelerator is C, the source accelerator does not perform acceleration.

2. Loop routing: The source accelerator sends the acceleration request packet to a destination node, and the packet needs to return to the source accelerator after arriving at the destination acceleration node. An entire acceleration path is a loop path.

Figure 3:
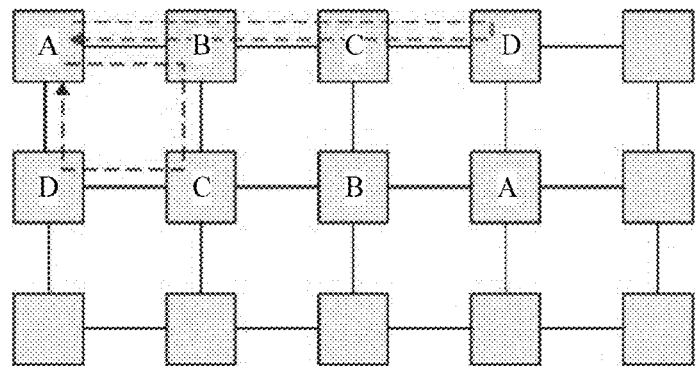
FIG. 3 is a schematic diagram of different loop paths in an accelerator network according to an embodiment of this application.

3. Routing including a plurality of acceleration sequences: As shown in FIG. 3, if type-A acceleration, type-B acceleration, type-C acceleration, and type-D acceleration need to be performed sequentially, during acceleration, an acceleration request packet needs to be sequentially routed to accelerators having an acceleration type A, an acceleration type B, an acceleration type C, and an acceleration type D for acceleration, and then, is returned. As can be learned from FIG. 3, there may be two manners of sequentially performing type-A acceleration, type-B acceleration, type-C acceleration, and type-D acceleration. In the first manner, the first line of accelerators having an acceleration type A, an acceleration type B, an acceleration type C, and an acceleration type D in the accelerator network are used to accelerate an application, and a total quantity of hops on an entire acceleration path is 6. In the second manner, accelerators having an acceleration type A, an acceleration type B, an acceleration type C, and an acceleration type D in an upper left corner in the accelerator network are used to accelerate the application, and a total quantity of hops on an entire acceleration path is 4. As can be learned, the two manners both can implement acceleration on the application, but the quantity of hops in the second manner is smaller (the path is shorter), and the acceleration path in the second manner is a preferred acceleration path.

Figure 4:
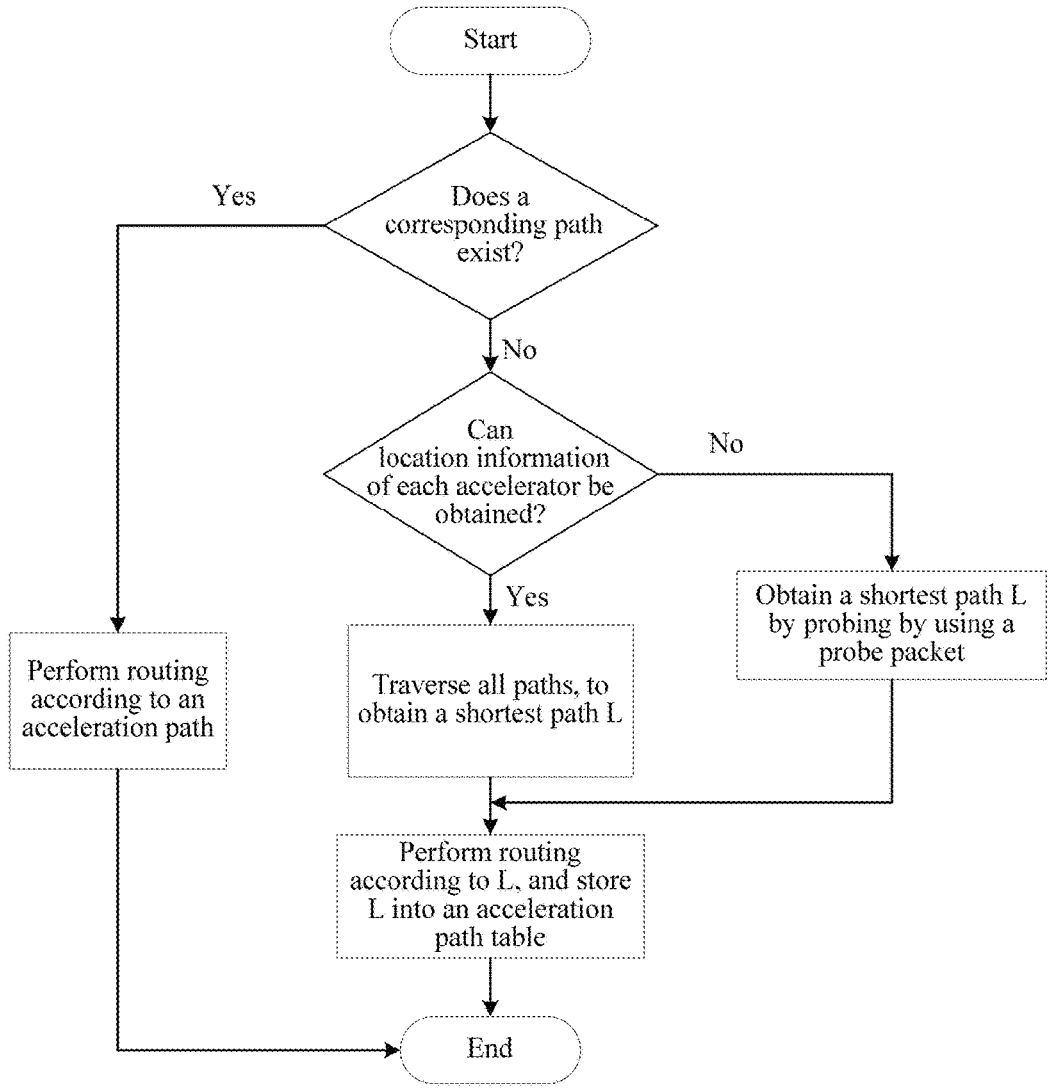
FIG. 4 is a schematic flowchart of a method for routing a packet in an accelerator network according to an embodiment of this application.

The following first describes a method for routing a packet in an accelerator network in an embodiment of this application with reference to FIG. 4. The method may be performed by any accelerator in the accelerator network.

As shown in FIG. 4, the accelerator receives an acceleration request packet from a CPU. The acceleration request packet indicates an acceleration sequence requested by the CPU. Subsequently, the accelerator starts to search for a target loop path corresponding to the acceleration request packet. First, the accelerator checks an acceleration path table of the accelerator to determine whether the acceleration path table includes the target loop path corresponding to the acceleration sequence in the acceleration request, and if the target loop path exists, the accelerator routes the packet based on the corresponding target loop path. Because the acceleration path table has pre-stored a shortest loop path corresponding to the acceleration sequence, the shortest loop path corresponding to the acceleration sequence can be directly obtained from the acceleration path table.

Second, if the acceleration path table does not include the target loop path corresponding to the acceleration sequence in the acceleration request, the accelerator obtains, from an acceleration information table of the accelerator, information about a plurality of accelerators corresponding to the acceleration sequence in the acceleration request. If the acceleration information table includes location information of the plurality of accelerators corresponding to the acceleration sequence in the acceleration request, in other words, the location information of the plurality of accelerators can be obtained by using the acceleration information table, all paths corresponding to the acceleration sequence in the acceleration request may be traversed, and a path having a shortest Manhattan distance is selected as a target loop path L, the acceleration request packet is routed based on L, and L is stored into the acceleration path table of the accelerator.

Finally, if the acceleration path table of the accelerator does not include the target loop path corresponding to the acceleration sequence, and the acceleration information table of the accelerator does not include the information about the plurality of accelerators corresponding to the acceleration sequence either, in other words, not all information about the plurality of accelerators can be obtained by using the acceleration information table, the accelerator may send a probe packet to a nearby accelerator. The nearby accelerator determines, based on an acceleration path table or an acceleration information table of the nearby accelerator, a target loop path corresponding to the acceleration request. After the shortest path L corresponding to the acceleration sequence is found, the packet is routed based on L, and L is stored into the acceleration path table.

Figure 5:
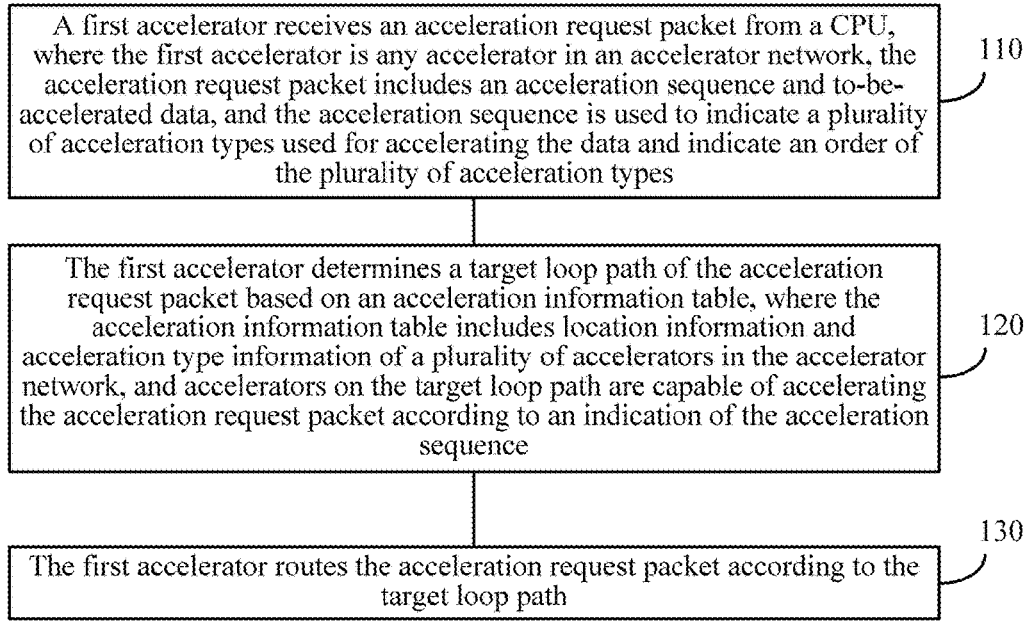
FIG. 5 is a schematic flowchart of a method for routing a packet in an accelerator network according to an embodiment of this application.

FIG. 5 is a schematic flowchart of a method for choosing to route a packet in an accelerator network according to an embodiment of this application. The method may be performed by any accelerator in the accelerator network. The method includes the following operations.

Operation 110. A first accelerator receives an acceleration request packet from a CPU, where the first accelerator is any accelerator in the accelerator network, the acceleration request packet includes an acceleration sequence and data to be accelerated, and the acceleration sequence is used to indicate a plurality of acceleration types used for accelerating the data and indicate an order of the plurality of acceleration types.

It should be understood that the CPU herein may be a CPU connected to the first accelerator, and an application needing to be accelerated may be located in the CPU. In this way, the CPU may send an acceleration request packet corresponding to the application to the first accelerator. The acceleration sequence is used to indicate types of accelerators that need to accelerate the acceleration request sent by the CPU. For example, an acceleration sequence included in an acceleration request packet is ABCD. It represents that the acceleration request sent by the CPU needs a sequential acceleration service of an acceleration type A, an acceleration type B, an acceleration type C, and an acceleration type D. In other words, to implement the acceleration request, accelerators having the acceleration type A, the acceleration type B, the acceleration type C, and the acceleration type D in the accelerator network need to perform acceleration sequentially. The first accelerator herein may be any accelerator in the accelerator network.

Operation 120. The first accelerator determines a target loop path of the acceleration request packet based on an acceleration information table, where the acceleration information table includes location information and acceleration type information of other accelerators in the accelerator network, and accelerators on the target loop path are capable of performing acceleration processing on the acceleration request packet according to an indication of the acceleration sequence.

Optionally, in an embodiment, the accelerator may obtain, from the acceleration information table, coordinate information of a node corresponding to each acceleration type in the acceleration sequence in the accelerator network (each acceleration type may correspond to one or more accelerators), separately calculate Manhattan distances of loops that sequentially pass through the first accelerator, the accelerators that correspond to the acceleration types in the sequence request and that are recorded in the acceleration information table, and the first accelerator, select a path L having a shortest Manhattan distance as the target loop path of the acceleration request packet, and add information about each accelerator on the path L to a routing header in the acceleration packet and send the acceleration packet to a corresponding port. In this way, when another accelerator obtains the acceleration packet, the accelerator may obtain the path L from the packet, and store L into an acceleration path table of the accelerator. In addition, the first accelerator may further store the calculated target loop path L into an acceleration path table of the first accelerator, and after receiving a same acceleration request next time, the first accelerator acceleration node may directly obtain L from the acceleration path table as the target loop path.

The acceleration information table may store, by using an acceleration type as an index, coordinate information of one or more accelerator nodes corresponding to each acceleration type in the accelerator network (store a node having a shorter Manhattan distance in each quadrant). The acceleration information table may be specifically in a form shown in table 1.

TABLE 1

Acceleration information table

| Acceleration type | Coordinate information sequence |
|---|---|
| A | (0, 0) |
| B | (0, 1) |
|   | (0, m) |
| C | (0, 2) |
|   | (1, 1) |
| D | (1, 0) |
| ... | ... |
| X | (n, m) |

Figure 6:
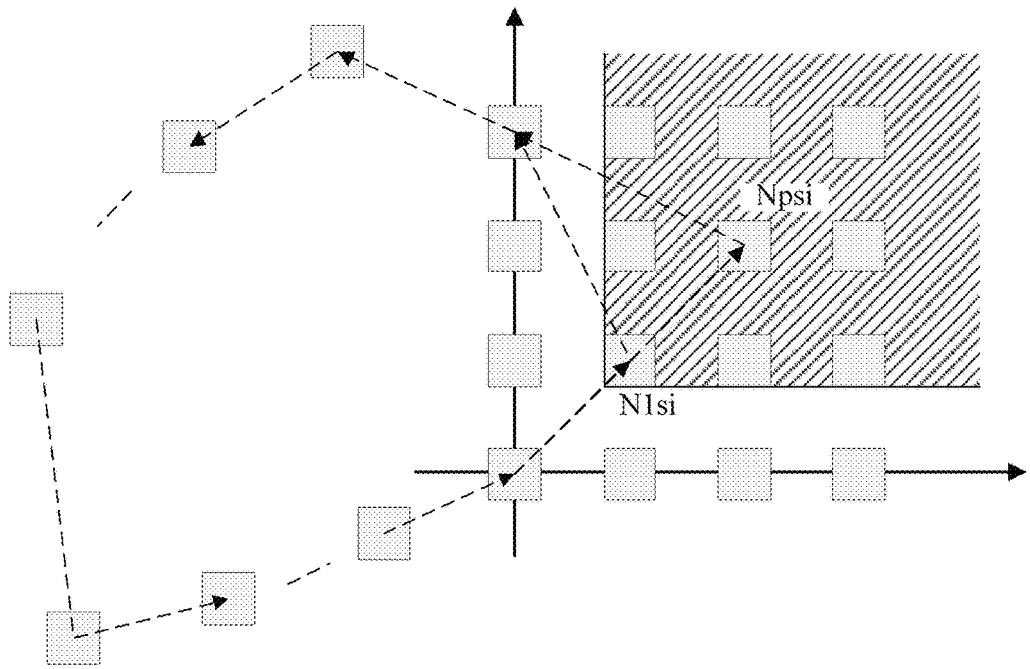
FIG. 6 is a schematic diagram of reducing a quantity of traversed paths by avoiding an accelerator in a coverage area in a method for routing a packet in an accelerator network according to an embodiment of this application.

Specifically, when the path L having the shortest Manhattan distance is selected as a routing path of a current acceleration sequence request, an acceleration node covered by a coverage area may be avoided to reduce a quantity of traversed paths. As shown in FIG. 6, Npsi is covered by N1si. Therefore, a path including Npsi does not need to be calculated when an acceleration routing path is calculated. In this way, a calculation amount can be reduced in a calculation process, and a shortest loop path can be quickly determined.

Figure 7:
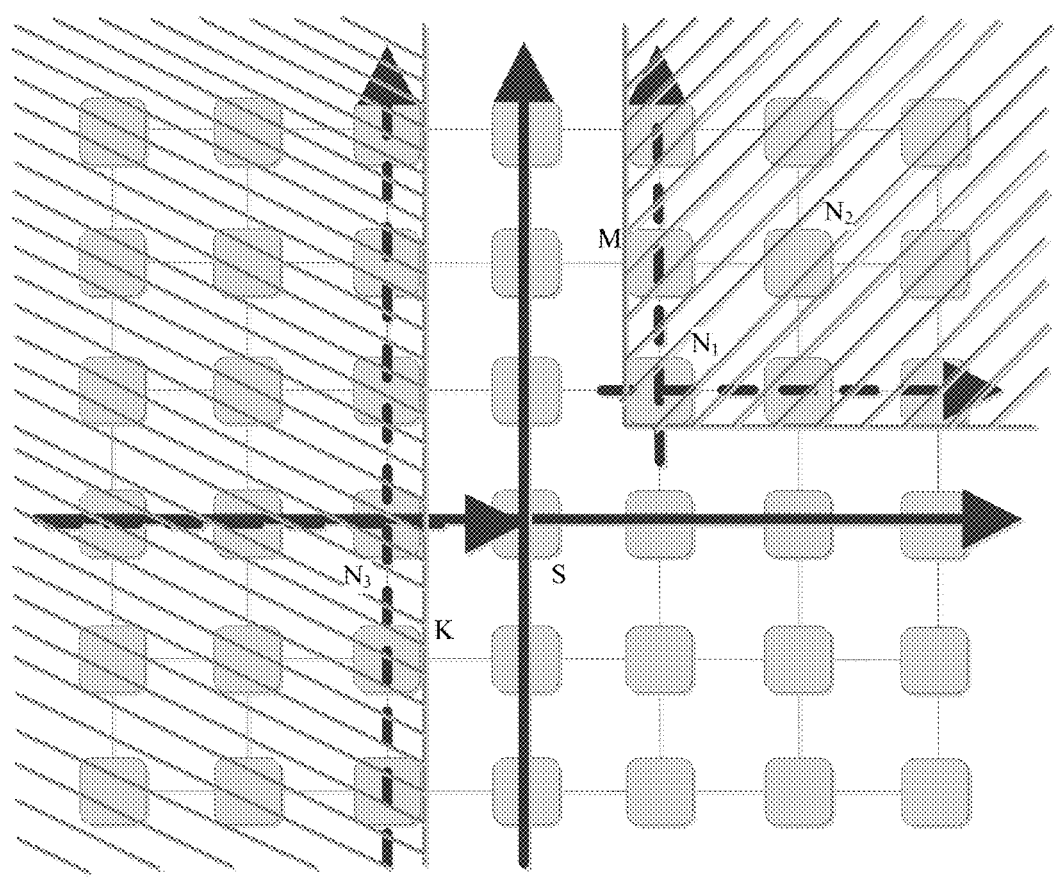
FIG. 7 is a schematic diagram of a coverage area in an accelerator network according to an embodiment of this application.

Definition of the coverage area is as follows:

As shown in FIG. 7, using a current accelerator as an origin of coordinates, a coverage area of an accelerator N1 is an area in which absolute values of all horizontal coordinates and vertical coordinates are greater than or equal to a horizontal coordinate and a vertical coordinate of N1, and a shadow area shown in an upper right corner in FIG. 7 is the coverage area of N1. If the accelerator N1 is located in an $n^{th}$ quadrant using the current accelerator S as the origin of coordinates, the $n^{th}$ quadrant using the current node N1 as an origin of coordinates is referred to as a coverage quadrant of N1. For example, as shown in FIG. 7, the accelerator N1 is located in the first quadrant using the current accelerator S as the origin of coordinates, and the first quadrant using N1 as the origin of coordinates is referred to as a coverage quadrant of N1. If N1 is located on a semi axis in a particular direction of a coordinate system using the current accelerator S as the origin of coordinates, a semi plane in this direction of a coordinate system using N1 as the origin of coordinates is referred to as a coverage semi plane of N1. The coverage quadrant and the coverage semi plane are collectively referred to as coverage areas.

For the current accelerator S, an acceleration information table of the current accelerator S records only information about an acceleration node that is not located in any coverage area, for example, N1 and N3 in FIG. 7. For N2, because N1 and N2 both are located in the first quadrant, and a Manhattan distance between N1 and the origin of coordinates is less than a Manhattan distance between N2 and the origin of coordinates, the acceleration information table of the current accelerator records only node information of N1 and N3, but does not record information about N2. Specifically, if the current accelerator receives an acceleration request whose acceleration sequence is NM, the current accelerator selects a path including N1 and M as a target loop path; if the current accelerator receives an acceleration request whose acceleration sequence is NK, the current accelerator selects a path including N3 and K as a target loop path.

Figure 8:
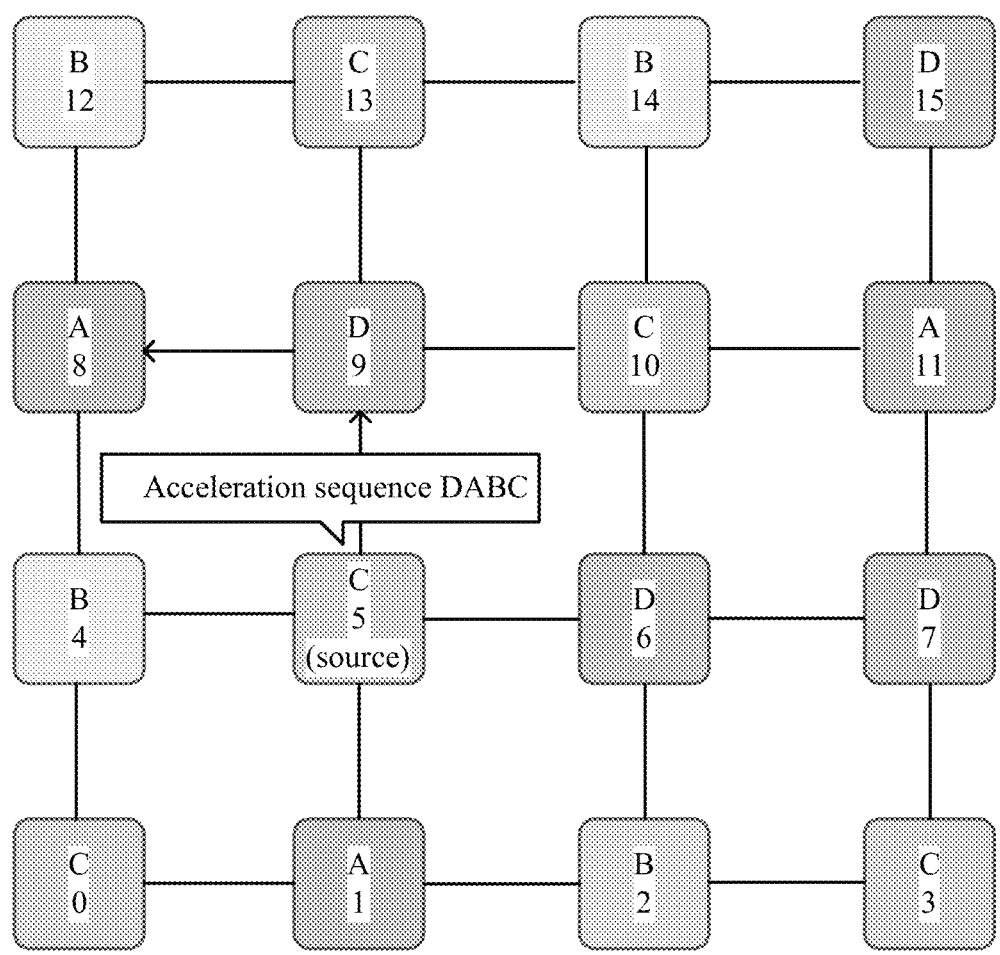
FIG. 8 is a schematic diagram of selecting a target loop path from an accelerator network in a method for routing a packet in the accelerator network according to an embodiment of this application.

It should be understood that in this embodiment of this application, when a loop path is determined, a smallest value of routing of an entire acceleration path is considered, instead of only relying on calculation of a next hop on the path by each accelerator. As shown in FIG. 8, a source accelerator sends an acceleration request whose acceleration sequence is DABC. At point C, D9 is equivalent to D6, but a path D9-A8-B4-C5 has a shortest Manhattan distance, and obviously is a shortest path. A routing information table of the current node records routing information of D9, A8, and B4, and shortest loop routing of D9-A8-B4-C5 is selected.

Operation 130. The first accelerator routes the acceleration request packet according to the target loop path.

In this application, the first accelerator obtains, from the acceleration information table, the location information and the acceleration type information of the plurality of accelerators corresponding to the acceleration sequence, then, determines the target loop path of the acceleration request packet based on the information, and routes the acceleration packet according to the target loop path. Therefore, a loop path can be determined for an acceleration request packet having a plurality of target accelerators in the accelerator network.

Figure 9:
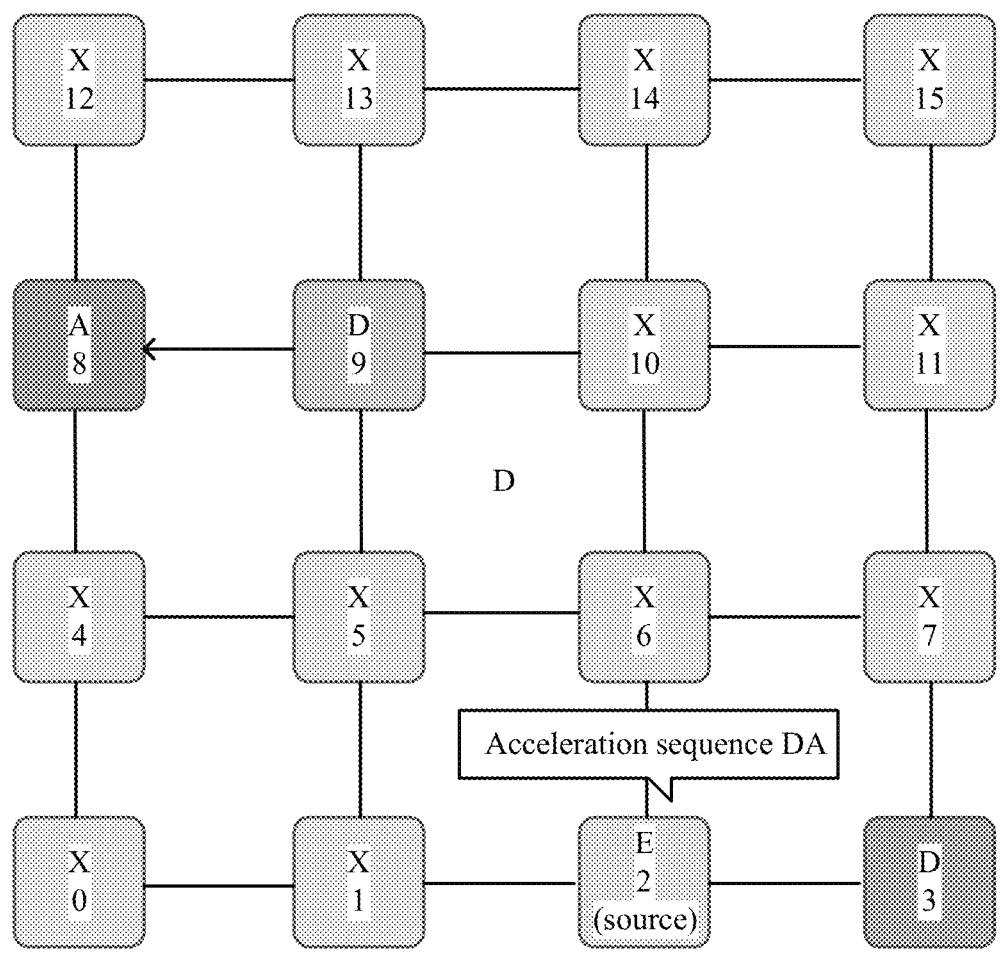
FIG. 9 is a schematic diagram of obtaining a target loop path by using a probe packet in a method for routing a packet in an accelerator network according to an embodiment of this application.

Optionally, in an embodiment, when the first accelerator cannot determine the target loop path of the acceleration request packet based on the acceleration information table of the first accelerator, the first accelerator may further send a probe packet to another accelerator in the accelerator network. Specifically, as shown in FIG. 9, because a distance of a routing range of local flooding is 3, E2 can perceive only D9, but cannot perceive A8. After E2 receives an acceleration request packet whose acceleration sequence is DA, the first accelerator sends a probe packet. Specifically, the first accelerator separately sends the probe packet to D9 and D3. After the acceleration probe packet passes through D9, the packet is sent to A8, and A8 returns a feedback packet to E2. The feedback packet includes coordinate information of A8 and a total quantity 8 of acceleration hops. Because the probe packet sent to D3 cannot perceive any type-A accelerator, the acceleration probe packet arrives at D9 by passing through a path of X7, X11, X10, and D9 based on an XY two-dimensional routing manner, and then arrives at A8. Finally, A8 feeds back a feedback packet to E2, and the feedback packet includes coordinate information of A8 and a total quantity 10 of acceleration hops. After receiving the two feedback packets, E2 may select a path having a smaller quantity of hops as a target loop path. Herein, because a quantity of hops of path E2-D9-A8-E2 is smaller, the path E2-D9-A8-E2 may be used as the target loop path, and the target loop path is stored into the acceleration path table.

Optionally, in an embodiment, the first accelerator may further send a probe packet to another accelerator in the accelerator network. The another accelerator obtains the target loop path based on an acceleration path table or an acceleration information table of the another accelerator, and feeds back the target loop path to the first accelerator. Specifically, as shown in FIG. 9, after receiving an acceleration request packet whose acceleration sequence is DA, E2 may send a probe packet to D3. D3 determines a target loop path based on an acceleration path table or an acceleration information table of D3, and D3 feeds back the target loop path to E2 by using a feedback packet. If D3 cannot determine the target loop path, D3 may forward the probe packet to X7. X7 determines the target loop path, and X7 feeds back the target loop path to E2 by using a feedback packet.

Optionally, in an embodiment, the first accelerator stores the target loop path into the acceleration path table of the first accelerator based on the acceleration sequence, so that the first accelerator obtains the target loop path from the acceleration path table after receiving the acceleration request packet.

Specifically, the target loop path pre-stored in the acceleration path table may be a target loop path calculated by the first accelerator in a previous acceleration process, or may be a target loop path obtained by the first accelerator from another accelerator. In this way, after receiving the same acceleration request packet, the first accelerator may directly obtain, from the acceleration path table based on the acceleration sequence indicated in the acceleration request packet, the target loop path corresponding to the acceleration sequence, thereby reducing a calculation process of the first accelerator, and improving acceleration efficiency. The acceleration path table may include information such as coordinate information and acceleration type information of each accelerator on a loop path, and a loop distance of the loop path. A specific form of the acceleration path table may be shown in Table 2.

TABLE 2

Acceleration path table

| Acceleration type | Coordinates of accelerators | Loop distance |
| --- | --- | --- |
| ABCD | (0, 0)->(0, 1)->(1, 0)->(1, 1) | 4 |
| AEFG | (0, 0)->(0, 4)->(1, 3)->(2, 3) | 12 |
| ... | ... | ... |

Optionally, in an embodiment, before the receiving, by the first accelerator, the acceleration request packet, the method further includes: receiving, by the first accelerator, a flood packet sent by any one of other accelerators in the accelerator network, where the flood packet includes acceleration type information and location information of the any one accelerator; and subsequently, storing, by the first accelerator, the acceleration type information and the location information of the any one accelerator into a node information table of the first accelerator.

The node information table records acceleration type information of each accelerator in the accelerator network by using accelerator coordinates (X+Y coordinates) as an index, and may fill information about some accelerators during initialized local flooding. Information about other accelerators may further be added and updated to the node information table based on information carried in a returned acceleration complete packet. In addition, the node information table may further support centralized configuration. A specific form of the node information table may be shown in Table 3.

TABLE 3

Node information table

| Coordinate information | Acceleration type | Manhattan distance |
| --- | --- | --- |
| (0, 0) | A | 0 |
| (0, 1) | B | 1 |
| (0, 2) | C | 2 |
| ... | ... | ... |
| (0, m) | B | m |
| (1, 0) | D | 1 |
| (1, 1) | C | 2 |
| ... | ... | ... |
| (n, m) | X | N + m |

Optionally, in an embodiment, after receiving the flood packet sent by another accelerator node in the accelerator network, the first accelerator queries the acceleration information table of the first accelerator, and determines, based on a situation, whether to update the acceleration information table. Specifically, for example, after an accelerator M_node having an acceleration type M receives a flood packet Ax of an accelerator A_node having an acceleration type A, the accelerator M_node queries an acceleration information table of the M_node. If the acceleration information table records one or more nodes A0, A1, . . . , and An having the acceleration type A, the M_node determines, by using the node M_node as an origin of coordinates, whether the A_node corresponding to Ax is a node having a shorter Manhattan distance to M_node in a quadrant of the A_node, in other words, whether absolute values of coordinates of the node A_node are smaller. If the A_node has a shorter Manhattan distance, the M_node updates information about the A_node to the acceleration information table, and deletes another accelerator that is in the same quadrant and has a same acceleration type, and that has larger absolute values of coordinates. If the A_node does not have a shorter Manhattan distance, the M_node does not need to update information about the A_node to the acceleration information table. Specifically, if an accelerator a in the node information table and an accelerator b in the acceleration information table have a same acceleration type, and a and b are located in a same quadrant in a coordinate system using the first accelerator as an origin of coordinates, absolute values of a horizontal coordinate and a vertical coordinate of a and absolute values of a horizontal coordinate and a vertical coordinate of b are separately determined, and if the absolute values of the horizontal coordinate and the vertical coordinate of a are respectively less than the absolute values of the horizontal coordinate and the vertical coordinate of b, location information and acceleration type information of a are stored into the acceleration information table of the first accelerator.

In this embodiment of this application, because a series of calculations need to be performed in a process of updating the acceleration information table, a rate of updating the acceleration information table may be less than a flood packet receiving rate, and related information of some accelerators may be lost if the acceleration information table is not processed in time. Therefore, to resolve this problem, after receiving information about another accelerator, the first accelerator may first store the information about the another accelerator into the node information table of the first accelerator, and then determine whether to update the information about the another accelerator to the acceleration information table. Therefore, this avoids a problem of an accelerator information loss caused because the flood packet receiving rate exceeds the rate of updating the acceleration information table.

Optionally, in an embodiment, after the first accelerator gets online, the first accelerator sends a flood packet including acceleration type information and coordinate information of the first accelerator to another accelerator in the accelerator network. It should be understood that local flooding is performed herein. A range of local flooding is related to a quantity of acceleration types of the accelerators in the accelerator network. For example, the accelerator network may provide N acceleration types, and the range of local flooding may be set to N. In other words, the first accelerator may send the coordinate information and the acceleration type information of the first accelerator to an accelerator whose distance to the first accelerator is N. If the accelerator network includes a relatively small quantity of acceleration types, the range of local flooding may be set to 2*N, 4*N, or the like, to select an optimal path in a wider range. It should be understood that after getting online, any accelerator in the accelerator network may send a flood packet to another nearby accelerator as the first accelerator does. It should be understood that in this embodiment of this application, local flooding is performed during initialization, thereby effectively avoiding large traffic caused by global flooding.

Figure 10:
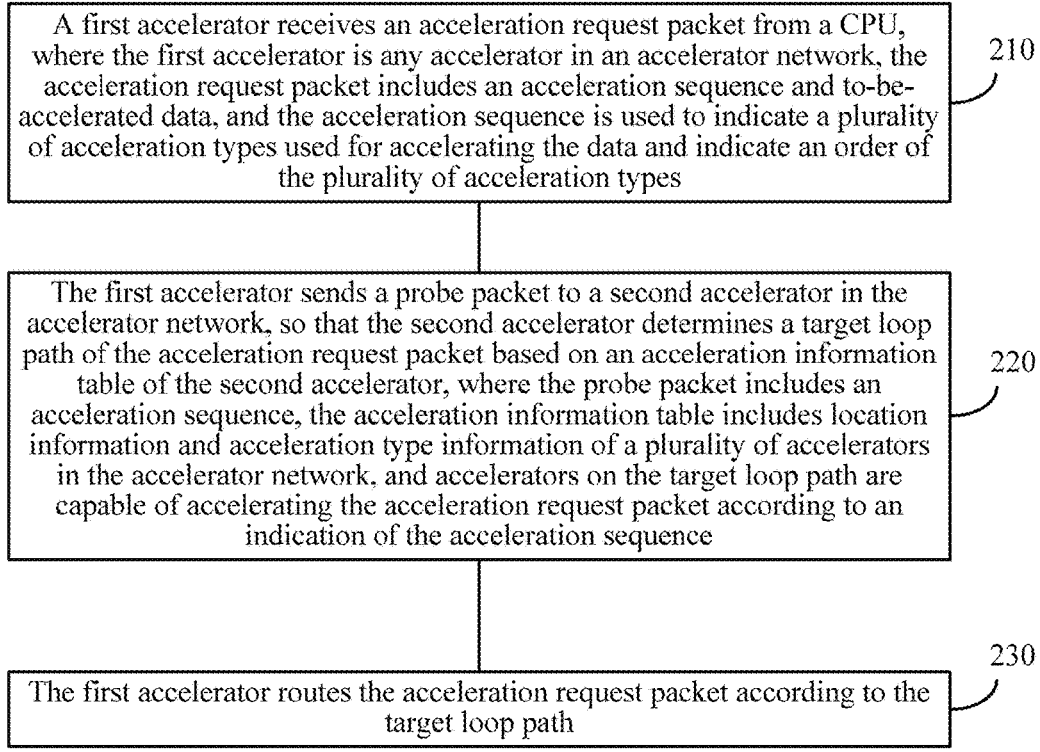
FIG. 10 is a schematic flowchart of a method for routing a packet in an accelerator network according to an embodiment of this application.

FIG. 10 is a schematic flowchart of a method for choosing to route a packet in an accelerator network according to an embodiment of this application. The method may be performed by any accelerator in the accelerator network. The method includes the following operations.

Operation 210. A first accelerator receives an acceleration request packet from a CPU, where the first accelerator is any accelerator in the accelerator network, the acceleration request packet includes an acceleration sequence and data to be accelerated, and the acceleration sequence is used to indicate a plurality of acceleration types used for accelerating the data and indicate an order of the plurality of acceleration types.

It should be understood that the CPU herein may be a CPU connected to the first accelerator, and an application needing to be accelerated may be located in the CPU. In this way, the CPU may send an acceleration request packet corresponding to the application to the first accelerator.

Operation 220. The first accelerator determines a target loop path of the acceleration request packet based on an acceleration information table, where the acceleration information table includes location information and acceleration type information of a plurality of accelerators in the accelerator network, and accelerators on the target loop path are capable of performing acceleration processing on the acceleration request packet according to an indication of the acceleration sequence.

The acceleration information table may store, by using an acceleration type as an index, coordinate information of one or more accelerator nodes corresponding to each acceleration type in the accelerator network (store a node having a shorter Manhattan distance in each quadrant). The acceleration information table may be in a form shown in table 1.

Operation 230. The first accelerator routes the acceleration request packet according to the target loop path.

In this application, the first accelerator sends a probe packet to another accelerator in the accelerator network, so that that accelerator determines the target loop path of the acceleration request packet. Therefore, a loop path can be quickly determined for an acceleration request packet having a plurality of target accelerators in the accelerator network.

It should be understood that the first accelerator not only may determine the target loop path based on the acceleration information table of the first accelerator, but also may send the probe packet to a nearby accelerator, so that the another accelerator determines the target loop path. Therefore, a loop path can be quickly determined for an acceleration request packet having a plurality of target accelerators in the accelerator network. In addition, the first accelerator determines the target loop path in a plurality of manners. Therefore, system reliability can be improved, and other accelerators can still determine the target loop path when the first accelerator cannot determine the target loop path based on the acceleration information table of the first accelerator. Further, the acceleration request packet is routed according to the target loop path.

The foregoing describes in detail the method for routing a packet in an accelerator network in the embodiments of this application with reference to FIG. 2 to FIG. 10. The following describes the apparatuses in the method for routing a packet in an accelerator network in the embodiments of this application with reference to FIG. 11 to FIG. 14. It should be understood that the apparatuses for routing a packet in FIG. 11 to FIG. 14 can implement the operations in the method for routing a packet in an accelerator network in FIG. 2 to FIG. 10. For brevity, repeated descriptions are omitted appropriately.

Figure 11:
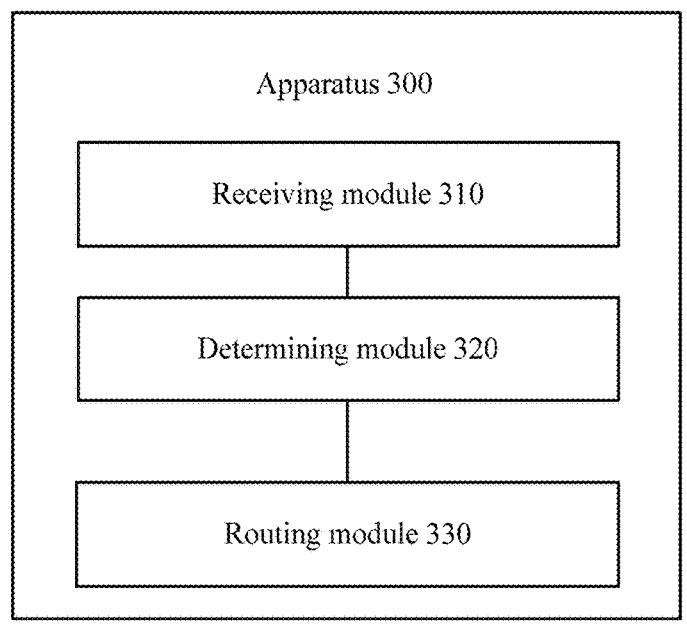
FIG. 11 is a schematic block diagram of an apparatus for routing a packet in an accelerator network according to an embodiment of this application.

FIG. 11 is a schematic block diagram of an apparatus 300 for routing a packet in an accelerator network according to an embodiment of this application. The apparatus in FIG. 11 can implement the operations in the method for routing a packet in an accelerator network in FIG. 2 to FIG. 9. To avoid repetition, details are not described herein again. The apparatus 300 includes:

a receiving module 310, configured to receive an acceleration request packet from a CPU, where the apparatus 300 is any accelerator in the accelerator network, the acceleration request packet includes an acceleration sequence and data to be accelerated, and the acceleration sequence is used to indicate a plurality of acceleration types used for accelerating the data and indicate an order of the plurality of acceleration types;

a determining module 320, configured to determine a target loop path of the acceleration request packet based on an acceleration information table, where the acceleration information table includes location information and acceleration type information of a plurality of accelerators in the accelerator network, and accelerators on the target loop path are capable of performing acceleration processing on the acceleration request packet according to an indication of the acceleration sequence; and a routing module 330, configured to route the acceleration request packet according to the target loop path determined by the determining module.

In this application, the apparatus 300 obtains, from the acceleration information table, location information and acceleration type information of a plurality of accelerators corresponding to the acceleration sequence, then, determines the target loop path of the acceleration request packet based on the information, and routes the acceleration packet according to the target loop path. Therefore, a loop path can be determined for an acceleration request packet having a plurality of target accelerators in the accelerator network.

Optionally, in an embodiment, the determining module 320 is configured to: obtain, based on the acceleration information table, the location information of the accelerators corresponding to the acceleration types in the acceleration sequence; and determine Manhattan distances of a plurality of loops including the apparatus 300 and the accelerators corresponding to the acceleration types in the acceleration sequence, and determine a loop having a shortest Manhattan distance as the target loop path.

Optionally, in an embodiment, the apparatus 300 further includes: a storage module 350, configured to store the target loop path into an acceleration path table of the apparatus 300, so that the apparatus 300 obtains the target loop path from the acceleration path table after receiving the acceleration request packet.

Optionally, in an embodiment, the receiving module 310 is further configured to receive a first flood packet sent by a third accelerator, where the third accelerator is any accelerator other than the apparatus 300 in the accelerator network, and the first flood packet includes acceleration type information and location information of the third accelerator. The storage module is configured to store the acceleration type information and the location information of the third accelerator into a node information table of the apparatus 300. The apparatus further includes: an updating module 360, configured to update the acceleration information table based on the acceleration type information and the location information of the third accelerator that are stored in the node information table.

Optionally, in an embodiment, the updating module 360 is configured to: obtain the acceleration type information and the location information of the third accelerator from the node information table; determine that the acceleration information table includes a fourth accelerator having a same acceleration type as that of the third accelerator; determine, by using a location of the apparatus 300 as an origin of coordinates, whether the third accelerator and the fourth accelerator are located in a same quadrant; if the third accelerator and the fourth accelerator are located in the same quadrant, determine absolute values of a horizontal coordinate and a vertical coordinate of the third accelerator and absolute values of a horizontal coordinate and a vertical coordinate of the fourth accelerator; and if the absolute values of the horizontal coordinate and the vertical coordinate of the third accelerator are respectively less than the absolute values of the horizontal coordinate and the vertical coordinate of the fourth accelerator, store the location information and the acceleration type information of the third accelerator into the acceleration information table, and delete location information and acceleration type information of the fourth accelerator that are stored in the acceleration information table.

Optionally, in an embodiment, the sending module 340 is further configured to send a second flood packet to another accelerator in the accelerator network, where a flood distance of the second flood packet is determined based on a quantity of acceleration types in the accelerator network, and the second flood packet includes acceleration type information and location information of the apparatus.

Figure 12:
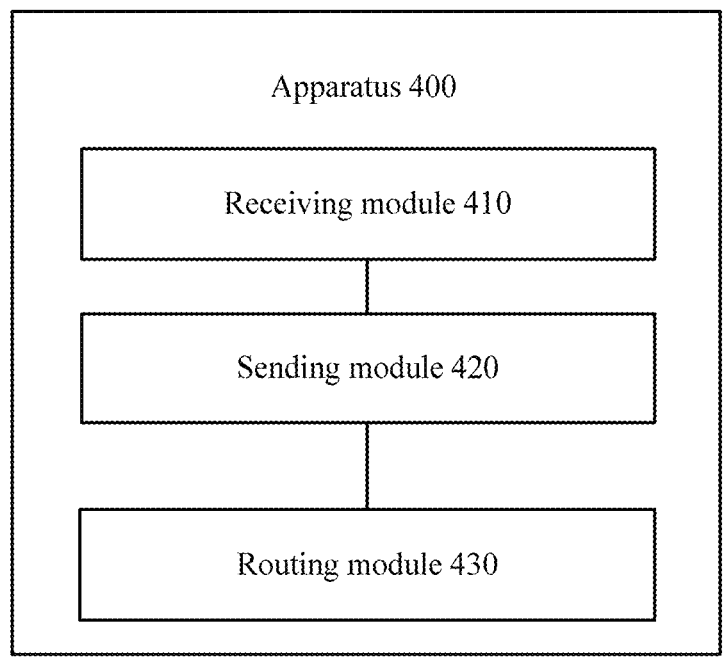
FIG. 12 is a schematic block diagram of an apparatus for routing a packet in an accelerator network according to an embodiment of this application.

FIG. 12 is a schematic block diagram of an apparatus for routing a packet in an accelerator network according to an embodiment of this application. The apparatus in FIG. 12 can implement the operations in the method for routing a packet in an accelerator network in FIG. 10. To avoid repetition, details are not described herein again. The apparatus 400 includes:

a receiving module 410, configured to receive an acceleration request packet from a CPU, where the apparatus is any accelerator in the accelerator network, the acceleration request packet includes an acceleration sequence and data to be accelerated, and the acceleration sequence is used to indicate a plurality of acceleration types used for accelerating the data and indicate an order of the plurality of acceleration types;

a sending module 420, configured to send a probe packet to a second accelerator in the accelerator network, so that the second accelerator determines a target loop path of the acceleration request packet based on an acceleration information table of the second accelerator, where the probe packet includes the acceleration sequence, the acceleration information table includes location information and acceleration type information of a plurality of accelerators in the accelerator network, and accelerators on the target loop path are capable of performing acceleration processing on the acceleration request packet according to an indication of the acceleration sequence; and a routing module 430, configured to route the acceleration request packet according to the target loop path determined by the second accelerator.

In this application, the apparatus 400 sends the probe packet to another accelerator in the accelerator network, so that the accelerator determines the target loop path of the acceleration request packet. Therefore, a loop path can be quickly determined for an acceleration request packet having a plurality of target accelerators in the accelerator network.

Figure 13:
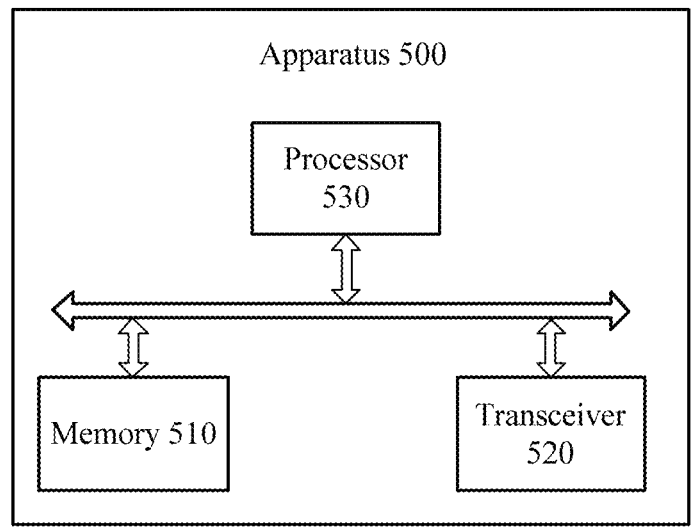
FIG. 13 is a schematic block diagram of an apparatus for routing a packet in an accelerator network according to an embodiment of this application.

FIG. 13 is a schematic block diagram of an apparatus for routing a packet in an accelerator network according to an embodiment of this application. The apparatus in FIG. 13 can implement the operations in the method for routing a packet in an accelerator network in FIG. 2 to FIG. 9. To avoid repetition, details are not described herein again. The apparatus 500 includes:

a memory 510, configured to store a program;

a transceiver 520, configured to receive an acceleration request packet from a CPU, where the apparatus 500 is any accelerator in the accelerator network, the acceleration request packet includes an acceleration sequence and data to be accelerated, and the acceleration sequence is used to indicate a plurality of acceleration types used for accelerating the data and indicate an order of the plurality of acceleration types; and a processor 530, configured to: determine a target loop path of the acceleration request packet based on an acceleration information table, where the acceleration information table includes location information and acceleration type information of a plurality of accelerators in the accelerator network, and accelerators on the target loop path are capable of performing acceleration processing on the acceleration request packet according to an indication of the acceleration sequence; and route the acceleration request packet according to the target loop path.

In this application, the apparatus 500 obtains, from the acceleration information table, location information and acceleration type information of a plurality of accelerators corresponding to the acceleration sequence, then, determines the target loop path of the acceleration request packet based on the information, and routes the acceleration packet according to the target loop path. Therefore, a loop path can be determined for an acceleration request packet having a plurality of target accelerators in the accelerator network.

Optionally, in an embodiment, the processor 530 is configured to: obtain, based on the acceleration information table, the location information of the accelerators corresponding to the acceleration types in the acceleration sequence; and determine Manhattan distances of a plurality of loops including the apparatus 300 and the accelerators corresponding to the acceleration types in the acceleration sequence, and determine a loop having a shortest Manhattan distance as the target loop path.

Optionally, in an embodiment, the processor 530 is configured to store the target loop path into an acceleration path table of the apparatus 500, so that the apparatus 500 obtains the target loop path from the acceleration path table after receiving the acceleration request packet.

Optionally, in an embodiment, the transceiver 520 is configured to receive a first flood packet sent by a third accelerator, where the third accelerator is any accelerator other than the apparatus 500 in the accelerator network, and the first flood packet includes acceleration type information and location information of the third accelerator. The memory 510 is configured to store the acceleration type information and the location information of the third accelerator into a node information table of the apparatus 500. The processor 530 is configured to update the acceleration information table based on the acceleration type information and the location information of the third accelerator that are stored in the node information table.

Optionally, in an embodiment, the processor 530 is configured to: obtain the acceleration type information and the location information of the third accelerator from the node information table; determine that the acceleration information table includes a fourth accelerator having a same acceleration type as that of the third accelerator; determine, by using a location of the apparatus 500 as an origin of coordinates, whether the third accelerator and the fourth accelerator are located in a same quadrant; if the third accelerator and the fourth accelerator are located in the same quadrant, determine absolute values of a horizontal coordinate and a vertical coordinate of the third accelerator and absolute values of a horizontal coordinate and a vertical coordinate of the fourth accelerator; and if the absolute values of the horizontal coordinate and the vertical coordinate of the third accelerator are respectively less than the absolute values of the horizontal coordinate and the vertical coordinate of the fourth accelerator, store the location information and the acceleration type information of the third accelerator into the acceleration information table, and delete location information and acceleration type information of the fourth accelerator that are stored in the acceleration information table.

Optionally, in an embodiment, the transceiver 520 is configured to send a second flood packet to another accelerator in the accelerator network, where a flood distance of the second flood packet is determined based on a quantity of acceleration types in the accelerator network, and the second flood packet includes acceleration type information and location information of the apparatus.

Figure 14:
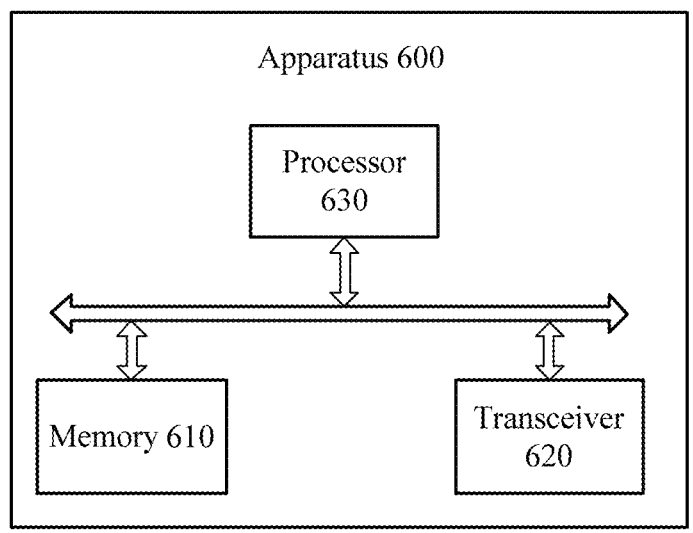
FIG. 14 is a schematic block diagram of an apparatus for routing a packet in an accelerator network according to an embodiment of this application.

FIG. 14 is a schematic block diagram of an apparatus for routing a packet in an accelerator network according to an embodiment of this application. The apparatus in FIG. 14 can implement the operations in the method for routing a packet in an accelerator network in FIG. 10. To avoid repetition, details are not described herein again. The apparatus 600 includes:

a memory 610, configured to store a program;

a transceiver 620, configured to receive an acceleration request packet from a CPU, where the apparatus is any accelerator in the accelerator network, the acceleration request packet includes an acceleration sequence and data to be accelerated, and the acceleration sequence is used to indicate a plurality of acceleration types used for accelerating the data and indicate an order of the plurality of acceleration types; and a processor 630, configured to: send a probe packet to a second accelerator in the accelerator network, so that the second accelerator determines a target loop path of the acceleration request packet based on an acceleration information table of the second accelerator, where the probe packet includes the acceleration sequence, the acceleration information table includes location information and acceleration type information of a plurality of accelerators in the accelerator network, and accelerators on the target loop path are capable of performing acceleration processing on the acceleration request packet according to an indication of the acceleration sequence; and route the acceleration request packet according to the target loop path determined by the second accelerator.

In this application, the apparatus 600 sends the probe packet to another accelerator in the accelerator network, so that the another accelerator determines the target loop path of the acceleration request packet. Therefore, a loop path can be quickly determined for an acceleration request packet having a plurality of target accelerators in the accelerator network.

It should be understood that the term "and/or" in this specification describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects.

It should be understood that sequence numbers of the foregoing processes do not mean execution sequences in various embodiments of this application. The execution sequences of the processes should be determined according to functions and internal logic of the processes, and should not be construed as any limitation on the implementation processes of the embodiments of this application.

A person of ordinary skill in the art may be aware that, the units and algorithms in the examples described with reference to the embodiments disclosed in this specification may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a detailed working process of the system, apparatus, and unit, refer to a corresponding process in the method embodiments. Details are not described herein again.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on multiple network units. Some or all of the units may be selected according to actual needs to achieve the objectives of the solutions of the embodiments.

In addition, functional units in the embodiments of this application may be integrated into one processing unit, or each of the units may exist alone physically, or two or more units are integrated into one unit.

When the functions are implemented in a form of a software functional unit and sold or used as an independent product, the functions may be stored in a computer-readable storage medium. Based on such an understanding, the technical solutions of this application essentially, or the part contributing to the prior art, or some of the technical solutions may be implemented in a form of a software product. The software product is stored in a storage medium, and includes several instructions for instructing a computer device (which may be a personal computer, a server, or a network device) to perform all or some of the operations of the methods described in the embodiments of the present invention. The foregoing storage medium includes: any medium that can store program code, such as a universal serial bus (USB) flash drive, a removable hard disk, a read-only memory (ROM), a random access memory (RAM), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A method for routing a packet in an accelerator network, wherein the accelerator network comprises a plurality of interconnected accelerators, each accelerator is connected to one central processing unit (CPU), each accelerator corresponds to one acceleration type, the method comprising:
    receiving, by a first accelerator, an acceleration request packet from a CPU, wherein the first accelerator is any accelerator in the accelerator network, the acceleration request packet comprises an acceleration sequence and data to be accelerated, and the acceleration sequence is used to indicate a plurality of acceleration types used for accelerating the data and indicate an order of the plurality of acceleration types;
    determining, by the first accelerator, a target loop path of the acceleration request packet based on an acceleration information table, wherein the acceleration information table comprises location information and acceleration type information of the plurality of accelerators in the accelerator network, and accelerators on the target loop path are capable of performing acceleration processing on the acceleration request packet according to an indication of the acceleration sequence; and
    routing, by the first accelerator, the acceleration request packet according to the target loop path.

2. The method according to claim 1, wherein the determining, by the first accelerator, a target loop path of the acceleration request packet based on an acceleration information table comprises:
    obtaining, by the first accelerator based on the acceleration information table, location information of accelerators corresponding to the acceleration types in the acceleration sequence; and
    determining, by the first accelerator, Manhattan distances of a plurality of loops comprised of the first accelerator and the accelerators corresponding to the acceleration types in the acceleration sequence, and determining a loop having a shortest Manhattan distance as the target loop path.

3. The method according to claim 1, wherein after the first accelerator determines the target loop path, the method further comprises:
    storing, by the first accelerator, the target loop path into an acceleration path table of the first accelerator, so that the first accelerator can obtain the target loop path from the acceleration path table after receiving the acceleration request packet.

4. The method according to claim 1, further comprising:
    receiving, by the first accelerator, a first flood packet from a third accelerator, wherein the third accelerator is any accelerator other than the first accelerator in the accelerator network, and the first flood packet comprises acceleration type information and location information of the third accelerator;
    storing, by the first accelerator, the acceleration type information and the location information of the third accelerator into a node information table of the first accelerator; and
    updating, by the first accelerator, the acceleration information table based on the acceleration type information and the location information of the third accelerator that are stored in the node information table.

5. The method according to claim 4, wherein the updating, by the first accelerator, the acceleration information table based on the acceleration type information and the location information of the third accelerator that are stored in the node information table comprises:
    obtaining, by the first accelerator, the acceleration type information and the location information of the third accelerator from the node information table;
    determining, by the first accelerator, that the acceleration information table comprises a fourth accelerator having a same acceleration type as of the third accelerator;
    determining, by the first accelerator using a location of the first accelerator as an origin of coordinates, whether the third accelerator and the fourth accelerator are located in a same quadrant;
    if the third accelerator and the fourth accelerator are located in the same quadrant, determining absolute values of a horizontal coordinate and a vertical coordinate of the third accelerator and absolute values of a horizontal coordinate and a vertical coordinate of the fourth accelerator; and
    if the absolute values of the horizontal coordinate and the vertical coordinate of the third accelerator are respectively less than the absolute values of the horizontal coordinate and the vertical coordinate of the fourth accelerator, storing the location information and the acceleration type information of the third accelerator into the acceleration information table, and deleting location information and acceleration type information of the fourth accelerator that are stored in the acceleration information table.

6. The method according to claim 1, further comprising:
sending, by the first accelerator, a second flood packet to another accelerator in the accelerator network, wherein a flood distance of the second flood packet is determined based on a quantity of acceleration types in the accelerator network, and the second flood packet comprises acceleration type information and location information of the first accelerator.

7. A method for routing a packet in an accelerator network, wherein the accelerator network comprises a plurality of interconnected accelerators, each accelerator is connected to one central processing unit (CPU), each accelerator corresponds to one acceleration type, the method comprising:
receiving, by a first accelerator, an acceleration request packet from a CPU, wherein the first accelerator is any accelerator in the accelerator network, the acceleration request packet comprises an acceleration sequence and data to be accelerated, and the acceleration sequence is used to indicate a plurality of acceleration types used for accelerating the data and indicate an order of the plurality of acceleration types;
sending, by the first accelerator, a probe packet to a second accelerator in the accelerator network, so that the second accelerator can determine a target loop path of the acceleration request packet based on an acceleration information table of the second accelerator, wherein the probe packet comprises the acceleration sequence, the acceleration information table comprises location information and acceleration type information of the plurality of accelerators in the accelerator network, and accelerators on the target loop path are capable of performing acceleration processing on the acceleration request packet according to an indication of the acceleration sequence; and
routing, by the first accelerator, the acceleration request packet according to the target loop path.

8. An apparatus for routing a packet in an accelerator network, wherein the apparatus is applied to the accelerator network, the accelerator network comprises a plurality of interconnected accelerators, each accelerator is connected to one central processing unit (CPU), each accelerator corresponds to one acceleration type, the apparatus comprising:
a receiving module configured to receive an acceleration request packet from a CPU, wherein the apparatus is any accelerator in the accelerator network, the acceleration request packet comprises an acceleration sequence and data to be accelerated, and the acceleration sequence is used to indicate a plurality of acceleration types used for accelerating the data and indicate an order of the plurality of acceleration types;
a determining module configured to determine a target loop path of the acceleration request packet based on an acceleration information table, wherein the acceleration information table comprises location information and acceleration type information of the plurality of accelerators in the accelerator network, and accelerators on the target loop path are capable of performing acceleration processing on the acceleration request packet according to an indication of the acceleration sequence; and
a routing module configured to route the acceleration request packet according to the target loop path determined by the determining module.

9. The apparatus according to claim 8, wherein the determining module is configured to:
obtain, based on the acceleration information table, location information of accelerators corresponding to the acceleration types in the acceleration sequence; and
determine Manhattan distances of a plurality of loops comprised of the apparatus and the accelerators corresponding to the acceleration types in the acceleration sequence, and determine a loop having a shortest Manhattan distance as the target loop path.

10. The apparatus according to claim 8, further comprising:
a storage module, configured to store the target loop path into an acceleration path table of the apparatus, so that the apparatus can obtain the target loop path from the acceleration path table after receiving the acceleration request packet.

11. The apparatus according to claim 8, wherein the receiving module is further configured to receive a first flood packet from a third accelerator, wherein the third accelerator is any accelerator other than the apparatus in the accelerator network, and the first flood packet comprises acceleration type information and location information of the third accelerator;
the storage module is configured to store the acceleration type information and the location information of the third accelerator into a node information table of the apparatus; and
wherein the apparatus further comprises:
an updating module configured to update the acceleration information table based on the acceleration type information and the location information of the third accelerator that are stored in the node information table.

12. The apparatus according to claim 11, wherein the updating module is configured to:
obtain the acceleration type information and the location information of the third accelerator from the node information table;
determine that the acceleration information table comprises a fourth accelerator having a same acceleration type as that of the third accelerator;
determine, using a location of the apparatus as an origin of coordinates, whether the third accelerator and the fourth accelerator are located in a same quadrant;
if the third accelerator and the fourth accelerator are located in the same quadrant, determine absolute values of a horizontal coordinate and a vertical coordinate of the third accelerator and absolute values of a horizontal coordinate and a vertical coordinate of the fourth accelerator; and
if the absolute values of the horizontal coordinate and the vertical coordinate of the third accelerator are respectively less than the absolute values of the horizontal coordinate and the vertical coordinate of the fourth accelerator, store the location information and the acceleration type information of the third accelerator into the acceleration information table, and delete location information and acceleration type information of the fourth accelerator that are stored in the acceleration information table.

13. The apparatus according to claim 8, wherein the sending module is further configured to send a second flood packet to another accelerator in the accelerator network, wherein a flood distance of the second flood packet is determined based on a quantity of acceleration types in the accelerator network, and the second flood packet comprises acceleration type information and location information of the apparatus.

14. An apparatus for routing a packet in an accelerator network, wherein the apparatus is applied to the accelerator network, the accelerator network comprises a plurality of interconnected accelerators, each accelerator is connected to one central processing unit (CPU), each accelerator corresponds to one acceleration type, the apparatus comprising:
   a receiving module configured to receive an acceleration request packet from a CPU, wherein the first accelerator is any accelerator in the accelerator network, the acceleration request packet comprises an acceleration sequence and to-be-accelerated data, and the acceleration sequence is used to indicate a plurality of acceleration types used for accelerating the data and indicate an order of the plurality of acceleration types;
   a sending module configured to send a probe packet to a second accelerator in the accelerator network, so that the second accelerator can determine a target loop path of the acceleration request packet based on an acceleration information table of the second accelerator, wherein the probe packet comprises the acceleration sequence, the acceleration information table comprises location information and acceleration type information of the plurality of accelerators in the accelerator network, and accelerators on the target loop path are capable of performing acceleration processing on the acceleration request packet according to an indication of the acceleration sequence; and
   a routing module configured to route the acceleration request packet according to the target loop path determined by the second accelerator.

* * * * *